United States Patent
Hatazaki et al.

(10) Patent No.: US 11,454,744 B2
(45) Date of Patent: Sep. 27, 2022

(54) METHOD FOR PRODUCING MICROLENS AND PLASMA PROCESSING APPARATUS

(71) Applicant: Tokyo Electron Limited, Tokyo (JP)

(72) Inventors: Yoshinari Hatazaki, Miyagi (JP); Takashi Shinyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 289 days.

(21) Appl. No.: 16/644,333

(22) PCT Filed: Jun. 7, 2019

(86) PCT No.: PCT/JP2019/022782
§ 371 (c)(1),
(2) Date: Mar. 4, 2020

(87) PCT Pub. No.: WO2019/244677
PCT Pub. Date: Dec. 26, 2019

(65) Prior Publication Data
US 2020/0192004 A1    Jun. 18, 2020

(30) Foreign Application Priority Data
Jun. 21, 2018  (JP) .............................. JP2018-117927

(51) Int. Cl.
*G02B 3/00* (2006.01)
*B29D 11/00* (2006.01)
*H01L 21/3065* (2006.01)
*H05H 1/46* (2006.01)

(52) U.S. Cl.
CPC ...... *G02B 3/0012* (2013.01); *B29D 11/00298* (2013.01); *B29D 11/00365* (2013.01); *G02B 3/0068* (2013.01); *H01L 21/3065* (2013.01); *H05H 1/46* (2013.01)

(58) Field of Classification Search
CPC ........ B29D 11/00298; B29D 11/00365; G02B 3/0012; G02B 3/0068; H01L 21/3065; H05H 1/46
See application file for complete search history.

(56) References Cited

U.S. PATENT DOCUMENTS

2011/0065049 A1* 3/2011 Kushibiki ......... H01L 21/02115
430/313

FOREIGN PATENT DOCUMENTS

| JP | 2002361597 A | 12/2002 |
|---|---|---|
| JP | 2005101232 A | 4/2005 |
| JP | 2006190903 A | 7/2006 |

(Continued)

*Primary Examiner* — Mathieu D Vargot
(74) *Attorney, Agent, or Firm* — Nath, Goldberg & Meyer; Jerald L. Meyer; Tanya E. Harkins

(57) ABSTRACT

A method for producing a microlens according to the present invention includes an etching step and a surface treatment step. In the etching step, a target object which is obtained by forming a second organic film having a lens shape on a first organic film that is formed on a substrate is subjected to etching that uses a plasma of a first processing gas, while using the second organic film as a mask, so that the first organic film is etched so as to transfer the lens shape of the second organic film to the first organic film, thereby forming a microlens in the first organic film. In the surface treatment step, a surface treatment is performed so as to smooth the surface of the microlens that is formed in the first organic film.

7 Claims, 9 Drawing Sheets

(56) References Cited

FOREIGN PATENT DOCUMENTS

| | | |
|---|---|---|
| JP | 2007102196 A | 4/2007 |
| JP | 2007281414 A | 10/2007 |
| WO | 2012023402 A1 | 2/2012 |

* cited by examiner

FIG. 4

| Sample | Post-process | Surface state | Top view | Gap | Evaluation | | |
|---|---|---|---|---|---|---|---|
| | | | | | Surface roughened | Gap | Film peeled |
| 1 | No | | | 334.2nm | × | ○ | ○ |
| 2 | Trimming process only | | | 516.3nm | ○ | × | ○ |
| 3 | Deposition process only | | | 320.7nm | ○ | ○ | × |
| 4 | 2 cycles | | | 357.6nm | ○ | ○ | ○ |

FIG. 6

| Sample | Post-process | Deposition process | Trimming process | Surface state | Top view | Gap |
|---|---|---|---|---|---|---|
| 1 | No | — | — | | | 334.2nm |
| 5 | 1 cycle | 60 sec | 90 sec | | | 348.0nm |
| 6 | 3 cycles | 20 sec | 30 sec | | | 389.2nm |
| 7 | 6 cycles | 10 sec | 15 sec | | | 427.4nm |

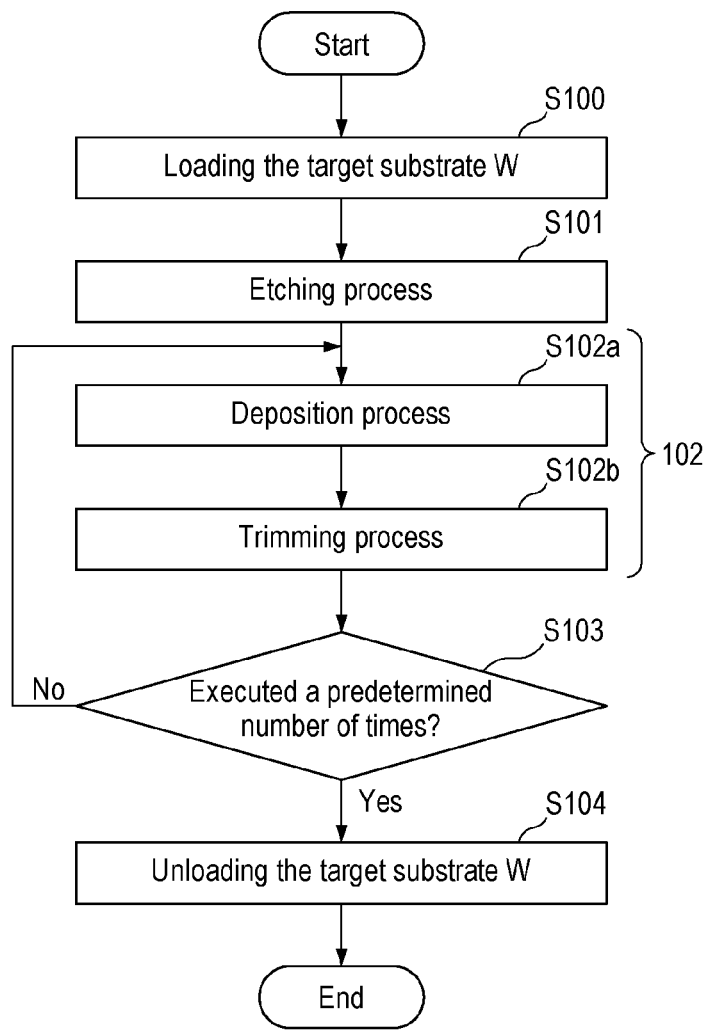

METHOD FOR PRODUCING MICROLENS AND PLASMA PROCESSING APPARATUS

CROSS-REFERENCE OF THE APPLICATION

This is a National Phase Application filed under 35 U.S.C. 371 as a national stage of PCT/JP2019/022782, filed Jun. 7, 2019, an application claiming the benefit of Japanese Application No. 2018-117927, filed Jun. 21, 2018, the content of each of which is hereby incorporated by reference in its entirety.

TECHNICAL FIELD

Various aspects and embodiments of the present disclosure relate to a microlens producing method and a plasma processing apparatus.

BACKGROUND

In recent years, the number of pixels of an imaging element such as a C-MOS or a CCD has been increasing. With the increase in the number of pixels, the size of each pixel in the imaging element has become smaller. Thus, insufficient sensitivity of a light receiving element due to a decrease in aperture ratio becomes a problem. In regard to such a problem of insufficient sensitivity, efforts have been made to improve sensitivity by forming microlenses on the light receiving element.

However, as described above, if the size of the pixel is reduced to about 2 μm, the aperture ratio of the formed microlenses is remarkably reduced. Thus, a problem of image quality deterioration such as insufficient sensitivity, smear, or the like becomes apparent.

As a technique for forming a microlens on a light receiving element, a transfer lens method is known (see e.g., Patent Document 1). In the transfer lens method, a hemispherical lens is formed by patterning a photosensitive resist having a heat flow property by photolithography and then performing a heat treatment. Then, the shape of the lens is transferred to a base resin layer by performing dry etching using the formed hemispherical lens as a mask.

PRIOR ART DOCUMENT

Patent Document

Patent Document 1: Japanese laid-open publication No. 2006-190903

SUMMARY

However, the microlenses formed by dry etching have rough lens surfaces. Therefore, light is scattered on the lens surfaces, and the light collection efficiency of the microlenses is low.

According to one embodiment of the present disclosure, there is provided a method for producing a microlens including an etching process and a surface treatment process. In the etching process, with respect to a target object in which a second organic film having a lens shape is formed on a first organic film formed on a substrate, the microlens is formed on the first organic film by etching the first organic film using the second organic film as a mask and using plasma of a first processing gas so as to transfer the lens shape of the second organic film to the first organic film. In the surface treatment process, a surface of the microlens formed on the first organic film is smoothed.

According to various aspects and embodiments of the present disclosure, it is possible to improve the light collection efficiency of microlenses.

BRIEF DESCRIPTION OF DRAWINGS

FIG. 4 is a view showing one example of a surface state of microlenses.

FIG. 6 is a view showing one example of surface states of the microlenses when the number of cycles is changed.

FIG. 8 is a flowchart showing one example of a microlens producing procedure.

DETAILED DESCRIPTION

Embodiments of a microlens producing method and a plasma processing apparatus disclosed herein will now be described in detail with reference to the drawings. The embodiments described below do not limit the microlens producing method and the plasma processing apparatus.

[Configuration of Plasma Processing Apparatus 10]

Figure 1:
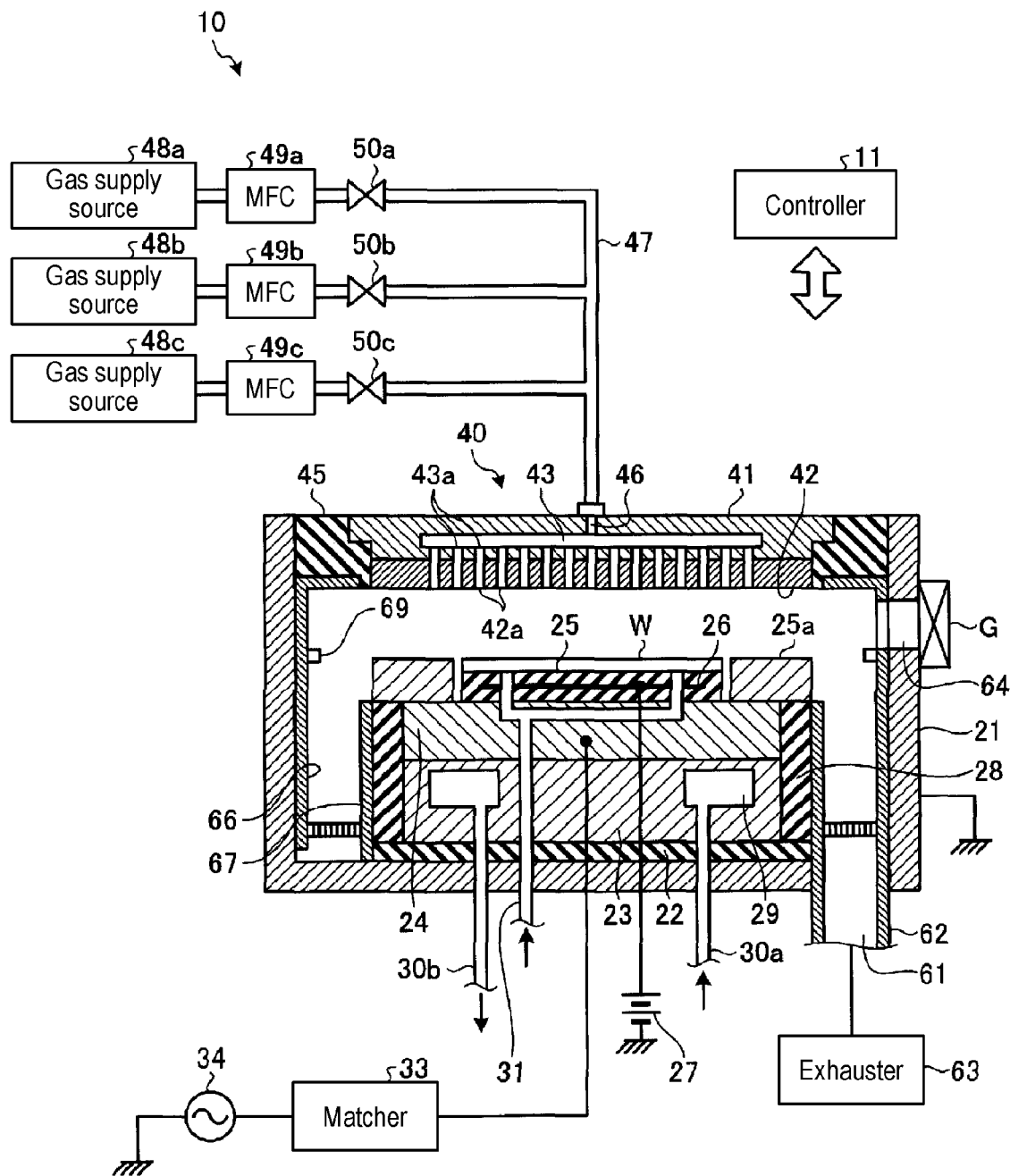
FIG. 1 is a schematic cross-sectional view illustrating an example of a plasma processing apparatus according to one embodiment of the present disclosure.

FIG. 1 is a diagram showing an example of a plasma processing apparatus 10 according to one embodiment of the present disclosure. The plasma processing apparatus 10 is formed of aluminum or the like whose surface is anodized. The plasma processing apparatus 10 includes a chamber 21 that defines a substantially cylindrical processing space therein, for example, as shown in FIG. 1. The chamber 21 is safety-grounded. The plasma processing apparatus 10 according to the present embodiment is configured as, for example, a capacitively coupled parallel plate plasma processing apparatus. In the chamber 21, a support base 23 is disposed via an insulating member 22 made of ceramics or the like. A susceptor 24 made of, for example, aluminum or the like and functioning as a lower electrode is provided on the support base 23.

An electrostatic chuck 25 for attracting and holding a target substrate W, which is an example of a target object, by an electrostatic force is provided substantially at a central upper portion of the susceptor 24. The electrostatic chuck 25 has a structure in which an electrode 26 formed of a conductive film or the like is sandwiched between a pair of insulating layers. A DC power supply 27 is electrically connected to the electrode 26. The electrostatic chuck 25 may be provided with a heater (not shown) for heating the target substrate W. The electrostatic chuck 25 is an example of a mounting table.

A focus ring 25a made of, for example, monocrystalline silicon or the like is disposed above the susceptor 24 so as to surround the electrostatic chuck 25. The focus ring 25a improves the uniformity of plasma processing near the edge of the target substrate W. An inner wall member 28 is provided around the support base 23 and the susceptor 24 so as to surround the support base 23 and the susceptor 24. The inner wall member 28 is formed in a substantially cylindrical shape by, for example, quartz or the like.

A coolant chamber 29 is formed inside the support base 23, for example, along the circumferential direction of the support base 23. A coolant controlled at a predetermined temperature is circulated and supplied to the coolant chamber 29 from a chiller unit (not shown) provided outside via a pipe 30a and a pipe 30b. By circulating the coolant through the coolant chamber 29, the target substrate W on the electrostatic chuck 25 can be controlled to a predetermined temperature by virtue of heat exchange with the coolant. Furthermore, a heat transfer gas supplied from a gas supply mechanism (not shown) is supplied, via a pipe 31, between an upper surface of the electrostatic chuck 25 and a back surface of the target substrate W mounted on the electrostatic chuck 25. The heat transfer gas is, for example, a helium gas.

An upper electrode 40 is provided above the susceptor 24 functioning as a lower electrode so as to face the susceptor 24 with a processing space interposed between the upper electrode 40 and the susceptor 24 in the chamber 21. A space between the upper electrode 40 and the susceptor 24 and surrounded by the chamber 21 is the processing space in which plasma is generated. The upper electrode 40 has a ceiling plate 42 that functions as an electrode main body, and a ceiling plate support portion 41 that supports the ceiling plate 42.

The ceiling plate support portion 41 is supported on an upper portion of the chamber 21 via an insulating member 45. The ceiling plate support portion 41 is formed in a substantially disk shape by a conductive material having relatively high thermal conductivity, such as aluminum whose surface is anodized, or the like. The ceiling plate support portion 41 also functions as a cooling plate that cools the ceiling plate 42 heated by the plasma generated in the processing space. The ceiling plate support portion 41 has a gas introduction port 46 configured to introduce a processing gas, a diffusion chamber 43 configured to diffuse the processing gas introduced from the gas introduction port 46, and a plurality of flow ports 43a, which are flow paths for allowing the processing gas diffused in the diffusion chamber 43 to flow downward.

The ceiling plate 42 is formed in a substantially disk shape by a material containing silicon atoms such as quartz or the like. The ceiling plate 42 has a plurality of gas discharge ports 42a penetrating the ceiling plate 42 in a thickness direction of the ceiling plate 42. Each gas discharge port 42a is arranged to communicate with any one of the flow ports 43a of the ceiling plate support portion 41. Thus, the processing gas supplied into the diffusion chamber 43 is diffused and supplied in a shower shape into the chamber 21 through the flow ports 43a and the gas discharge ports 42a.

A plurality of valves 50a to 50c is connected to the gas introduction port 46 of the ceiling plate support portion 41 via a pipe 47. A gas supply source 48a is connected to the valve 50a via a mass flow controller (MFC) 49a. When the valve 50a is controlled to an open state, the processing gas supplied from the gas supply source 48a is supplied into the chamber 21 via the pipe 47 with the flow rate of the processing gas being controlled by the MFC 49a. The gas supply source 48a supplies a gas containing carbon atoms and fluorine atoms into the chamber 21. In the present embodiment, the gas supply source 48a supplies, for example, a $CF_4$ gas into the chamber 21. The gas supplied from the gas supply source 48a into the chamber 21 is an example of a first processing gas. The gas supply sources 48a to 48c are examples of a gas supplier.

Furthermore, a gas supply source 48b is connected to the valve 50b via an MFC 49b. When the valve 50b is controlled to an open state, the gas supplied from the gas supply source 48b is supplied into the chamber 21 via the pipe 47 with the flow rate of the gas supplied from the gas supply source 48b being controlled by the MFC 49b. The gas supply source 48b supplies a gas containing carbon atoms and fluorine atoms into the chamber 21. In the present embodiment, the gas supply source 48b supplies, for example, a $C_4F_8$ gas into the chamber 21. Further, the gas supply source 48b may supply one or more gases selected from a $C_4F_6$ gas, a $C_4F_8$ gas, a $CHF_3$ gas, a $CH_2F_2$ gas, a $CH_3F$ gas, and a $CH_4$ gas into the chamber 21. The gas supplied from the gas supply source 48a and the gas supplied from the gas supply source 48b are mixed in the diffusion chamber 43 of the upper electrode 40 and supplied into the chamber 21. The gas obtained by mixing the gas supplied from the gas supply source 48a and the gas supplied from the gas supply source 48b is an example of a second processing gas.

Further, a gas supply source 48c is connected to the valve 50c via an MFC 49c. When the valve 50c is controlled to an open state, the gas supplied from the gas supply source 48c is supplied into the chamber 21 via the pipe 47 with the flow rate of the gas supplied from the gas supply source 48c being controlled by the MFC 49c. The gas supply source 48c supplies a gas containing oxygen atoms into the chamber 21. In the present embodiment, the gas supply source 48c supplies, for example, an $O_2$ gas into the chamber 21. The gas supply source 48c may supply a gas including at least one of an $O_2$ gas and a $CO_2$ gas into the chamber 21. The gas supplied from the gas supply source 48c into the chamber 21 is an example of a third processing gas.

The adjustment of the gas flow rate by each of the MFCs 49a to 49c and the opening/closing of each of the valves 50a to 50c are controlled by a controller 11 described later.

A high-frequency power source 34 is electrically connected to the susceptor 24 functioning as a lower electrode via a matcher 33. The high-frequency power source 34 supplies high-frequency power having a frequency of 27 MHz to 100 MHz, for example, 40 MHz, to the susceptor 24 via the matcher 33. By supplying the high-frequency power to the susceptor 24, plasma of a processing gas is generated in the processing space, active species such as ions or the like in the plasma are drawn onto the target substrate W on the electrostatic chuck 25, and the target substrate W is etched. The high-frequency power supplied from the high-frequency power source 34 is controlled by the controller 11 described later. The high-frequency power source 34 is an example of a plasma generator.

An exhaust port 61 is provided at the bottom of the chamber 21, and an exhauster 63 is connected to the exhaust port 61 via an exhaust pipe 62. The exhauster 63 includes a vacuum pump such as a dry pump (DP) or a turbo molecular pump (TMP), and can reduce the internal pressure of the chamber 21 to a desired degree of vacuum. The exhauster 63 is controlled by the controller 11 described later.

An opening 64 for loading and unloading the target substrate W is provided on a side wall of the chamber 21. The opening 64 can be opened and closed by a gate valve G. A deposit shield 66 is detachably provided on an inner wall of the chamber 21 along the wall surface. On an outer peripheral surface of the inner wall member 28, a deposit shield 67 is detachably provided along the outer peripheral surface of the inner wall member 28. The deposit shields 66 and 67 prevent reaction by-products, i.e., so-called deposits, from adhering to the inner wall and the inner wall member 28 of the chamber 21. Furthermore, a GND block 69 made of a conductive member and connected to the ground is provided at a position of the deposit shield 66 having substantially the same height as the target substrate W mounted on the electrostatic chuck 25. The GND block 69 prevents abnormal discharge in the chamber 21.

The operation of the above-described plasma processing apparatus 10 is totally controlled by the controller 11. The controller 11 includes, for example, a memory, a processor, and an input/output interface. The memory is, for example, a read only memory (ROM), a random access memory (RAM), a hard disk drive (HDD), a solid state drive (SSD), or the like. The processor is, for example, a central processing unit (CPU), a digital signal processor (DSP), or the like.

The memory stores a recipe including data of processing conditions for implementing various processes in the plasma processing apparatus 10 and a control program (software). The processor reads the control program from the memory, executes the control program thus read, and controls the respective parts of the plasma processing apparatus 10 via the input/output interface based on the recipe and the like stored in the memory. Thus, processing such as etching or the like is performed on the target substrate W by the plasma processing apparatus 10. The recipe containing the processing condition data or the like and the control program may be stored in a computer-readable recording medium or the like, or may be transmitted from another device via, for example, a communication line. The computer-readable recording medium is, for example, a hard disk, a compact disk (CD), a digital versatile disk (DVD), a flexible disk, a semiconductor memory, or the like.

[Structure of Substrate W]

Figure 2:
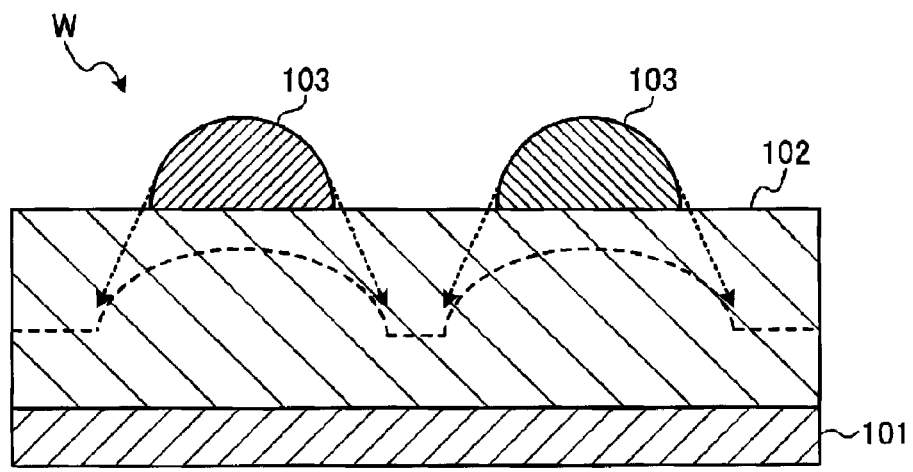
FIG. 2 is a cross-sectional view schematically showing one example of a target substrate.

FIG. 2 is a cross-sectional view schematically showing one example of the target substrate W. For example, as shown in FIG. 2, a transparent organic film 102 is laminated on a color filter 101, and a lens mask 103 formed into a lens shape is laminated on the transparent organic film 102 on the target substrate W. As a material of the transparent organic film 102, for example, an acrylic resin may be used. Examples of the acrylic resin include a thermosetting acrylic resin and a fluorine-containing acrylic resin. The color filter 101 is an example of a substrate, and the transparent organic film 102 is an example of a first organic film.

The lens mask 103 is formed by, for example, patterning a photosensitive resin layer laminated on the transparent organic film 102 into a shape corresponding to a shape of a photoelectric conversion element (not shown) disposed below the color filter 101, and is heat-treated. Thus, the lens mask 103 is formed into a lens shape, for example, as shown in FIG. 2. As a material of the lens mask 103, for example, a photosensitive resin having alkali solubility and heat flow property, such as a phenol resin or the like, may be used. The lens mask 103 is an example of a second organic film.

Figure 3:
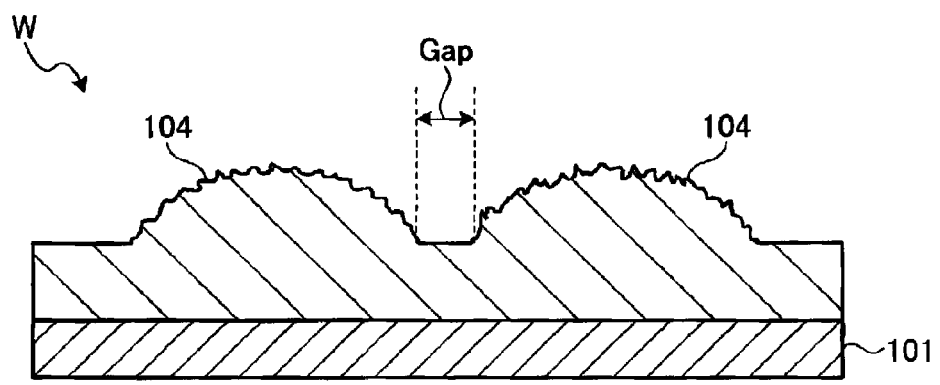
FIG. 3 is a cross-sectional view schematically showing one example of microlenses.

By performing dry etching on the target substrate W using the lens mask 103 as a mask, for example, as shown in FIG. 3, the shape of the lens mask 103 is transferred to the transparent organic film 102 below the lens mask 103, and a microlens 104 is formed. FIG. 3 is a cross-sectional view schematically showing one example of microlenses 104.

The main processing conditions of dry etching performed on the target substrate W using the lens mask 103 as a mask are, for example, as follows.

Etching gas: $CF_4$=250 sccm
Pressure in chamber 21: 40 mT
High-frequency power: 1,500 W
Processing time: 500 seconds In the microlenses 104 formed by dry etching, for example, as shown in FIG. 3, the surfaces of the microlenses 104 are rough. If the surfaces of the microlenses 104 are rough, the light incident on the microlenses 104 is scattered on the surfaces of the microlenses 104. Therefore, the light collection efficiency of the microlenses 104 is low. In order to increase the light collection efficiency of the microlenses 104, it is desirable that the surfaces of the microlenses 104 be smooth.

If the etching rate is too high, the transparent organic film 102 is cut too much, and the microlenses 104 become small. As the microlenses 104 become small, the gap between the microlenses 104 (see FIG. 3) becomes large, and the light collection area becomes small. For this reason, the light collection efficiency of the microlenses 104 is reduced. In order to increase the light collection efficiency of the microlenses 104, it is desirable to minimize the gap between the microlenses 104 as much as possible.

In addition, reaction by-products, i.e., so-called deposits, may adhere to the surfaces of the microlenses 104 formed by dry etching. The deposits adhering to the surfaces of the microlenses 104 may cause defects in a semiconductor producing process using the microlenses 104. Therefore, it is desirable to remove the deposits on the surfaces of the microlenses 104.

[Experimental Result]

FIG. 4 is a diagram showing one example of a surface state of the microlenses 104. In FIG. 4, the result of the evaluation for each sample is indicated as 'O' or 'X'. 'O' means good, and 'X' means poor. Sample 1 is a sample of the microlenses 104 formed by dry etching but not yet subjected to a post-process.

Sample 2 is a sample of the microlenses obtained by performing a trimming process as a post-process on the microlenses 104 formed by dry etching. The trimming process is a process of cutting the surfaces of the microlenses 104 formed of an organic film by the plasma of a gas containing oxygen atoms. The main processing conditions of the trimming process in Sample 2 are, for example, as follows.

Gas used: $O_2$ gas=1,200 sccm
Pressure in chamber 21: 800 mT
High-frequency power: 100 W
Processing time: 100 seconds Sample 3 is a sample of the microlenses formed by performing a deposition process as a post-process on the microlenses 104 formed by dry etching. The deposition process is a process of depositing CF-based deposits on the surfaces of the microlenses 104 by plasma of a gas containing carbon atoms and fluorine atoms. The main processing conditions of the deposition process in Sample 3 are, for example, as follows.

Gas used: $C_4F_8/CF_4$=5/50 sccm
Pressure in chamber 21: 80 mT
High-frequency power: 600 W
Processing time: 60 seconds Sample 4 is a sample of the microlenses obtained by alternately performing a deposition process and a trimming process twice on the microlenses 104 formed by dry etching. In the deposition process and the trimming process of Sample 4, the processing conditions other than the processing time are the same as those of Sample 2 or 3. In Sample 4, the deposition process for 10 seconds and the trimming process for 15 seconds were alternately performed twice.

Referring to the experimental results shown in FIG. 4, the surfaces of the microlenses 104 are rough in Sample 1, which has not been subjected to post-processing. In Sample 1 on which a post-process has not been performed, the gap between the microlenses 104 (the interval indicated by an arrow in FIG. 4) was 334.2 nm. In Sample 1, film peeling was not observed.

Further, in Sample 2 in which only the trimming process has been performed as a post-process, the surfaces of the microlenses 104 are smooth and due to the surfaces being smooth, improvement in light collection efficiency is expected. On the other hand, in Sample 2, the surfaces of the microlenses 104 are excessively cut, and the gap between the microlenses 104 is widely expanded to 516.3 nm. As a result, the light collection area of the microlenses 104 is reduced. Therefore, it is considered that the light collection efficiency of the microlenses 104 as a whole is not significantly improved in Sample 2 as compared with Sample 1.

Furthermore, in Sample 3 in which only the deposition process has been performed as a post-process, the surfaces of the microlenses 104 are smooth and due to the surfaces being smooth, improvement in light collection efficiency is expected. On the other hand, in Sample 3, the films of deposits deposited on the surfaces of the microlenses 104 were easy to peel off. As a result, in a semiconductor producing process using the microlenses 104, the films peeled off from the surfaces of the microlenses 104 may be a cause of defect. Moreover, in Sample 3, the gap between the microlenses 104 is reduced to 320.7 nm due to the deposits deposited on the surfaces of the microlenses 104.

In Sample 3, the surfaces of the microlenses 104 are made smooth by the deposition of the CF-based deposits on the surfaces of the microlenses 104. However, the refractive index of the CF-based deposits and the refractive index of the microlenses 104 are different. For this reason, when merely depositing the CF-based deposits on the surfaces of the microlenses 104, the light incident on the microlenses 104 is hindered by the deposits deposited on the surfaces of the microlenses 104. Therefore, it is considered that the light collection efficiency of the microlenses 104 is not significantly improved.

In contrast, in Sample 4, the surfaces of the microlenses 104 are smooth, and the expansion of the gap between the microlenses 104 has also been suppressed to 357.6 nm. In Sample 4, the deposits deposited on the surfaces of the microlenses 104 are removed by performing the trimming process at the end. Therefore, in Sample 4, the incidence of light on the microlenses 104 is not hindered by the deposits. Accordingly, in Sample 4, the light collection efficiency of the microlenses 104 can be improved as compared with Samples 1 to 3.

Further, in Sample 4, since the deposits deposited on the surfaces of the microlenses 104 are removed by the final trimming process, the films are hardly peeled off from the surfaces of the microlenses 104. Therefore, it is possible to avoid a decrease in the quality of a semiconductor that uses the microlenses 104.

[Smoothing Process]

Figure 5A:
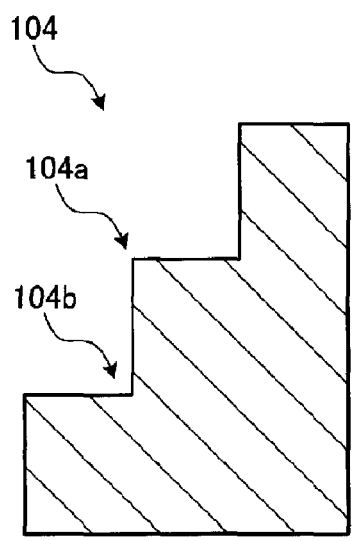
FIG. 5A is a view for explaining one example of a process of smoothing a surface of a microlens.

FIGS. 5A to 5E are diagrams for explaining an example of a process of smoothing the surface of the microlens 104. When a cross section near the surface of the microlens 104 formed by dry etching is enlarged, for example, as shown in FIG. 5A, a plurality of convex portions 104a and a plurality of concave portions 104b are formed.

Figure 5B:
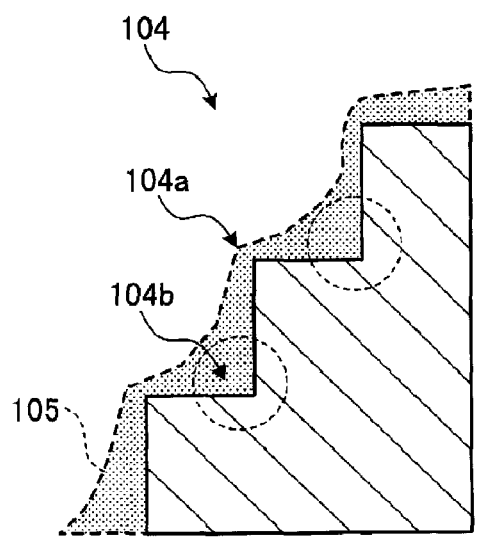
FIG. 5B is a view for explaining one example of a process of smoothing a surface of a microlens.

When the deposition process is performed on the microlens 104 formed by dry etching, for example, as shown in FIG. 5B, a deposit 105 is deposited on the surface of the microlens 104. At this time, for example, as indicated by dotted circles, a larger amount of the deposit 105 is accumulated in the concave portions 104b than in the convex portions 104a.

Figure 5C:
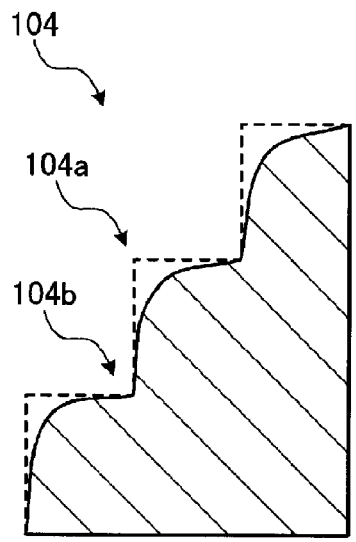
FIG. 5C is a view for explaining one example of a process of smoothing a surface of a microlens.

Then, when the trimming process is performed on the microlens 104 in which the deposit 105 is deposited on the surface thereof, the deposit 105 is removed more quickly near the convex portions 104a where the deposit 105 is relatively thin than near the concave portions 104b where the deposit 105 is relatively thick. Thus, for example, as shown in FIG. 5C, the vicinity of the convex portions 104a is cut more than the vicinity of the concave portions 104b, whereby the difference in height between the convex portions 104a and the concave portions 104b is reduced.

Figure 5D:
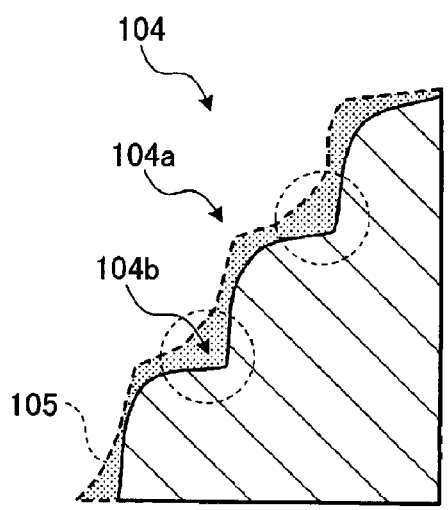
FIG. 5D is a view for explaining one example of a process of smoothing a surface of a microlens.

Then, when the deposition process is further performed, for example, as shown in FIG. 5D, the deposit 105 is deposited on the surface of the microlens 104. Even at this time, for example, as indicated by dotted circles, a larger amount of the deposit 105 is accumulated in the concave portions 104b than in the convex portions 104a.

Figure 5E:
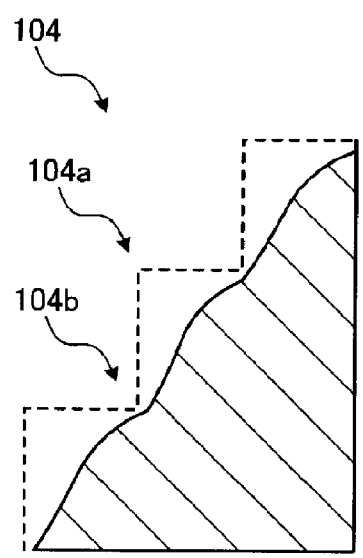
FIG. 5E is a view for explaining one example of a process of smoothing a surface of a microlens.

Then, when the trimming process is performed on the microlens 104 in which the deposit 105 is deposited on the surface thereof, for example, as shown in FIG. 5E, the vicinity of the convex portions 104a where the deposit 105 is relatively thin is cut more than the vicinity of the concave portions 104b where the deposit 105 relatively thick. By repeating the deposition process and the trimming process as described above, the difference in height between the convex portions 104a and the concave portions 104b is reduced, and the surface of the microlens 104 is smoothed.

When the deposition process and the trimming process are performed alternately, the CF-based deposit 105 remaining on the surface of the microlens 104 is removed by performing the trimming process at the end. Thus, it is possible to avoid a decrease in the quality of a semiconductor that uses the microlenses 104. Furthermore, when the deposition process and the trimming process are performed alternately, it is preferable to perform the deposition process first. Therefore, the concave portions 104b are protected by the deposit 105 before the trimming process is performed. This makes it possible to prevent the surfaces of the microlenses 104 from being unnecessarily cut, thereby suppressing a decrease in the area of the microlenses 104 and suppressing an increase in the gap between the microlenses 104.

[Relationship between Cycle Number and Gap]

FIG. 6 is a diagram showing one example of surface states of the microlenses 104 when the number of cycles is changed. In the experiments shown in FIG. 6, the surface condition of the microlens 104 was measured in the case where the cumulative processing time of the deposition process is fixed at 60 seconds, the cumulative processing time of the trimming process is fixed at 90 seconds, and the number of repetitions (cycle number) of the deposition process and the trimming process is changed. In Sample 5, the deposition process and the trimming process were performed once for each process. In Sample 6, the deposition process and the trimming process were alternately performed three times for each process. In Sample 7, the deposition process and the trimming process were alternately performed six times for each process.

Figure 7A:
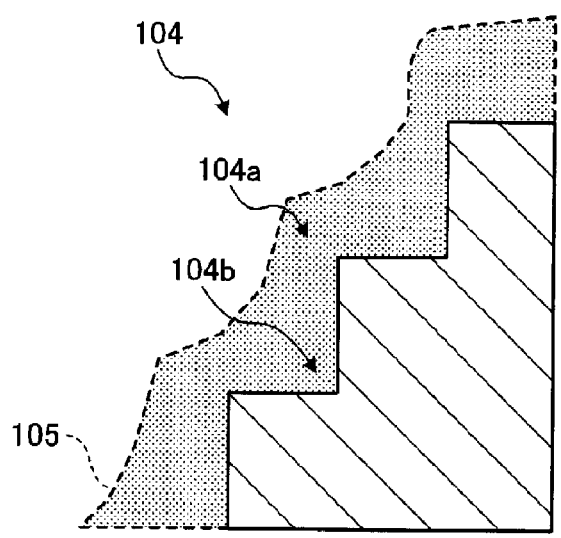
FIG. 7A is a view for explaining one example of a process of smoothing a surface of a microlens when the number of cycles of a deposition process and a trimming process is one.
Figure 7B:
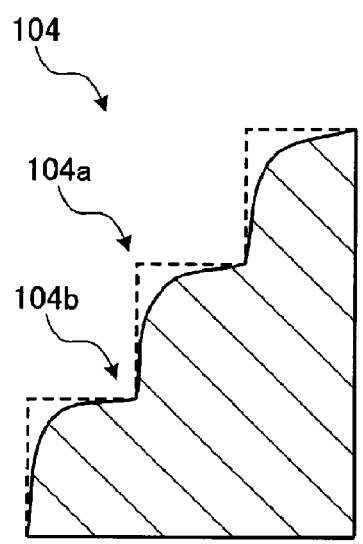
FIG. 7B is a view for explaining one example of a process of smoothing a surface of a microlens when the number of cycles of a deposition process and a trimming process is one.

Referring to FIG. 6, as the number of cycles increases, the surfaces of the microlenses 104 become smoother. If the number of cycles is small, the gas replacement time in the chamber 21 is shortened, which is preferable in terms of productivity. However, if the deposition process and the trimming process are performed once for each process, for example, as shown in FIG. 7A, the deposit 105 is stacked thick on the surface of the microlenses 104. Then, in the trimming process, the deposit 105 stacked thick on the convex portions 104a is cut until the convex portions 104a under the deposit 105 are exposed. The operation of cutting the deposit 105 is an unnecessary operation that does not directly contribute to the purpose of smoothing the surfaces of the microlenses 104. Therefore, if the deposition process and the trimming process are performed once for each process, the surfaces of the microlenses 104 are hardly smoothed, for example, as shown in FIG. 7B.

In contrast, when the number of cycles is two or more, the surfaces of the microlenses 104 are smoothed, for example, as described with reference to FIGS. 5A to 5E. Therefore, the number of cycles is preferably two or more from the perspective of improving the light collection efficiency of the microlenses 104 by making the surfaces of the microlenses 104 smooth.

However, referring to FIG. 6, the gap between the microlenses 104 becomes larger as the number of cycles increases. If the gap between the microlenses 104 becomes larger, the light collection area of the microlenses 104 is reduced and the light collection efficiency of the microlenses 104 is reduced. Therefore, from the perspective of suppressing a decrease in the area of the microlenses 104, it is preferable that the number of cycles is not too large. The number of cycles is preferably, for example, 2 to 3.

[Producing Procedure of Microlens 104]

FIG. 8 is a flowchart illustrating one example of a producing procedure of the microlenses 104. The production of the microlenses 104 is performed by the plasma processing apparatus 10 described with reference to FIG. 1. In addition, each of the steps described below is mainly controlled by the controller 11.

First, the target substrate W is loaded into the chamber 21 (S100). In step S100, the gate valve G is opened, and the target substrate W illustrated in FIG. 2 is loaded into the chamber 21 by a robot arm (not shown) and mounted on the electrostatic chuck 25. Then, the target substrate W is attracted and held on the upper surface of the electrostatic chuck 25 by the DC voltage supplied from the DC power supply 27 to the electrode 26 in the electrostatic chuck 25. Then, the gate valve G is closed.

Next, an etching process is performed on the target substrate W (S101). In step S101, the exhauster 63 is driven, and the internal pressure of the chamber 21 is reduced to a predetermined degree of vacuum. Then, the MFC 49a and the valve 50a are controlled to supply a predetermined flow rate of $CF_4$ gas into the chamber 21 via the upper electrode 40. High-frequency power having a predetermined power is supplied from the high-frequency power source 34 to the susceptor 24. Thus, plasma of the $CF_4$ gas is generated in the chamber 21, and dry etching is performed for a predetermined time on the target substrate W by the ions and radicals contained in the plasma using the lens mask 103 as a mask.

Next, a surface treatment process is performed on the target substrate W after the dry etching (S102). The surface treatment process includes a deposition process (S102a) and a trimming process (S102b). In the surface treatment process of the present embodiment, the deposition process (S102a) is performed first, and the trimming process (S102b) is performed next.

In step S102a, the MFC 49a, the MFC 49b, the valve 50a, and the valve 50b are controlled to supply a predetermined flow rate of $CF_4$ gas and a predetermined flow rate of $C_4F_8$ gas into the chamber 21 via the upper electrode 40. High-frequency power having a predetermined power is supplied from the high-frequency power source 34 to the susceptor 24. Thus, plasma of a mixed gas of the $CF_4$ gas and the $C_4F_8$ gas is generated in the chamber 21, and deposit 105 is deposited on the surfaces of the microlenses 104 by the ions and radicals contained in the plasma. Step S102a is performed, for example, for 10 seconds.

Next, a trimming process is performed on the target substrate W after the deposition process is performed (S102b). In step S102b, the MFC 49c and the valve 50c are controlled to supply a predetermined flow rate of $O_2$ gas into the chamber 21 via the upper electrode 40. High-frequency power having a predetermined power is supplied from the high-frequency power source 34 to the susceptor 24. Thus, plasma of the $O_2$ gas is generated in the chamber 21, and the surfaces of the microlenses 104 are trimmed by the ions and radicals contained in the plasma. Step S102b is performed, for example, for 15 seconds.

Next, it is determined whether or not the process of step S102 has been performed a predetermined number of times, i.e., whether or not the processes of steps S102a and S102b have been performed a predetermined number of times (S103). In the present embodiment, it is determined whether or not the process of step S102 has been performed twice or more, i.e., whether or not the processes of steps S102a and S102b have been performed twice for each process. If the process of step S102 has not been performed a predetermined number of times (if No in S103), the process of step S102a is performed again.

On the other hand, if the process of step S102 has been performed a predetermined number of times (if Yes in S103), the target substrate W is unloaded from the chamber 21 (S104). In step S104, the supply of the DC voltage from the DC power supply 27 to the electrode 26 in the electrostatic chuck 25 is stopped, and the gate valve G is opened. Then, the target substrate W subjected to the surface treatment is carried out of the chamber 21 by a robot arm (not shown). The producing procedure of the microlenses 104 shown in the flowchart is then completed.

The embodiment of the producing procedure of the microlenses 104 has been described above. The producing procedure of the microlens 104 in the present embodiment includes an etching process and a surface treatment process. In the etching process, with respect to the target substrate W in which the lens mask 103 having a lens shape is formed on the transparent organic film 102 formed on a substrate, the transparent organic film 102 is etched by using the lens mask 103 as a mask and using the plasma of the first processing gas. Thus, the lens shape of the lens mask 103 is transferred to the transparent organic film 102, and the microlenses 104 are formed on the transparent organic film 102. In the surface treatment process, the surfaces of the microlenses 104 formed on the transparent organic film 102 are treated so as to become smooth. Accordingly, it is possible to improve the light collection efficiency of the microlenses 104.

In the above-described embodiment, the surface treatment process includes a deposition process and a trimming process. In the deposition process, a predetermined film is deposited on the surfaces of the microlenses 104 formed on the transparent organic film 102. In the trimming process, the surfaces of the microlenses 104 on which the predetermined film has been deposited are trimmed. This makes it possible to reduce the unevenness of the surfaces of the microlenses 104.

In the above-described embodiment, the deposition process and the trimming process are alternately performed twice or more for each process. This makes it possible to reduce the unevenness of the surfaces of the microlenses 104.

In the above-described embodiment, the deposition process is performed at the beginning of the surface treatment process. Accordingly, it is possible to suppress a decrease in the area of the microlenses 104 due to the trimming process and to suppress a decrease in the light collection efficiency of the microlenses 104.

In the above-described embodiment, the trimming process is performed at the end of the surface treatment process. Accordingly, it is possible to suppress film peeling from the surfaces of the microlenses 104 and to suppress a decrease in the quality of a semiconductor device that uses the microlenses 104.

In the above-described embodiment, in the deposition process, a predetermined film is deposited on the surfaces of the microlenses 104 formed on the transparent organic film 102, by the plasma using the second processing gas containing carbon atoms and fluorine atoms. The second processing gas includes, for example, a mixed gas of a $CF_4$ gas and one or more gases selected from a $C_4F_6$ gas, a $C_4F_8$ gas, a $CHF_3$ gas, a $CH_2F_2$ gas, a $CH_3F$ gas, and a $CH_4$ gas. This makes it possible to deposit a predetermined film on the surfaces of the microlenses 104.

In the above-described embodiment, in the trimming process, the surfaces of the microlenses 104 on which the predetermined film is deposited is trimmed by the plasma formed using the third processing gas containing oxygen atoms. The third processing gas contains at least one of an $O_2$ gas and a $CO_2$ gas. Thus, the surfaces of the microlenses 104 on which the predetermined film is deposited are trimmed

[Others]

The technique disclosed herein is not limited to the above-described embodiment, and various modifications may be made within the scope of the spirit thereof.

For example, in the above-described embodiment, when the deposition process and the trimming process are alternately repeated two or more times, the processing time of each of the processes is kept constant. However, the disclosed technique is not limited thereto. The processing times may be different from each other. For example, the processing time of the $n^{-th}$ (n is an integer of 2 or more) trimming process may be shorter than the processing time of the $n-1)^{-th}$ trimming process. Furthermore, the processing time of the last trimming process may be the longest processing time among the processing times of the trimming processes performed a plurality of times. This makes it possible to reliably remove the deposits remaining on the surfaces of the microlenses 104.

Further, in the above-described embodiment, the capacitively coupled plasma (CCP) has been described as an example of the plasma generation method. The disclosed technique is not limited thereto. For example, the disclosed technique may be applied to a plasma processing apparatus that makes use of inductively coupled plasma (ICP), micro- wave-excited surface wave plasma (SWP), electron cyclotron resonance plasma (ECP), helicon-wave-excited plasma (HWP), or the like.

It should be understood that the embodiments disclosed this time are illustrative in all aspects and not restrictive. Indeed, the above embodiments may be realized in various forms. Furthermore, the above embodiments may be omitted, replaced, or changed in various forms without departing from the scope and spirit of the appended claims.

EXPLANATION OF REFERENCE NUMERALS

G: gate valve, W: target substrate, 10: plasma processing apparatus, 101: color filter, 102: transparent organic film, 103: lens mask, 104: microlens, 104a: convex portion, 104b: concave portion, 105: deposit, 11: controller, 21: chamber, 24: susceptor, 25: electrostatic chuck, 25a: focus ring, 29: coolant chamber, 33: matcher, 34: high-frequency power source, 40: upper electrode, 41: ceiling plate support portion, 42: ceiling plate, 63: exhauster

What is claimed is:

1. A method for producing a microlens, comprising:
an etching process of, with respect to a target object in which a second organic film having a lens shape is formed on a first organic film formed on a substrate, forming the microlens on the first organic film by etching the first organic film using the second organic film as a mask and using plasma of a first processing gas so as to transfer the lens shape of the second organic film to the first organic film; and
a surface treatment process of smoothing a surface of the microlens formed on the first organic film,
wherein the surface treatment process includes:
a deposition process of depositing a predetermined film on the surface of the microlens formed on the first organic film; and
a trimming process of trimming the surface of the microlens on which the predetermined film is deposited,
wherein the deposition process and the trimming process are alternately performed twice or more for each process in the surface treatment process,
wherein the deposition process is performed at the beginning of the surface treatment process, and
wherein the trimming process is performed at the end of the surface treatment process.

2. The method of claim 1, wherein in the deposition process, the predetermined film is deposited on the surface of the microlens formed on the first organic film by plasma generated using a second processing gas containing carbon atoms and fluorine atoms.

3. The method of claim 2, wherein the second processing gas includes a mixed gas of a $CF_4$ gas and one or more gases selected from a $C_4F_6$ gas, a $C_4F_8$ gas, a $CHF_3$ gas, a $CH_2F_2$ gas, a $CH_3F$ gas, and a $CH_4$ gas.

4. The method of claim 3, wherein in the trimming process, the surface of the microlens on which the predetermined film is deposited is trimmed by plasma generated using a third processing gas containing oxygen atoms.

5. The method of claim 4, wherein the third processing gas contains at least one of an $O_2$ gas and a $CO_2$ gas.

6. A plasma processing apparatus, comprising:
a chamber;
a mounting table provided in the chamber and configured to mount a target object on the mounting table;
a gas supplier configured to supply a first processing gas into the chamber;

a plasma generator configured to generate plasma of the first processing gas in the chamber; and a controller configured to perform the method of claim 5.

7. A plasma processing apparatus, comprising:

a chamber;

a mounting table provided in the chamber and configured to mount a target object on the mounting table;

a gas supplier configured to supply a first processing gas into the chamber;

a plasma generator configured to generate plasma of the first processing gas in the chamber; and a controller configured to perform the method of claim 1.

* * * * *